US011423303B1

(12) United States Patent
Jiao et al.

(10) Patent No.: US 11,423,303 B1
(45) Date of Patent: Aug. 23, 2022

(54) MACHINE LEARNING BASED METHODOLOGY FOR ADAPTATIVE EQUALIZATION

(71) Applicant: Xilinx, Inc., San Jose, CA (US)

(72) Inventors: Shuo Jiao, Sunnyvale, CA (US); Romi Mayder, Monte Sereno, CA (US); Bowen Li, Cary, NC (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 481 days.

(21) Appl. No.: 16/691,399

(22) Filed: Nov. 21, 2019

(51) Int. Cl.
*G06N 3/08* (2006.01)
*H03G 5/16* (2006.01)
*G06N 3/04* (2006.01)
*H03G 3/30* (2006.01)

(52) U.S. Cl.
CPC ............ *G06N 3/08* (2013.01); *G06N 3/0454* (2013.01); *H03G 5/165* (2013.01); *H03G 3/3089* (2013.01)

(58) Field of Classification Search
CPC ........ G06N 3/08; G06N 3/0454; H03G 5/165; H03G 3/3089
See application file for complete search history.

(56) References Cited

U.S. PATENT DOCUMENTS

| 8,775,341 B1 * | 7/2014 | Commons ............. G06F 40/253 706/20 |
| 10,192,016 B2 | 1/2019 | Ng et al. |
| 2019/0080223 A1 * | 3/2019 | Fraser ....................... G06N 3/04 |
| 2019/0114533 A1 | 4/2019 | Ng et al. |

OTHER PUBLICATIONS

Daniel B. Araya, Katarina Grolinger, Hany F. Elyamany, Miriam A.M. Capretz, Girma Bitsuamlak, An ensemble learning framework for anomaly detection in building energy consumption, Energy and Buildings 144 (2017), Mar. 10, 2017, p. 191-206, 16 pages.
Valiance Solutions, Improving Predictions with Ensemble Model, Aug. 11, 2016, [online], [retrieved on Sep. 2019]. Retrieved from the Internet <https://www.datasciencecentral.com/profiles/blogs/improving-predictions-with-ensemble-model>, 5 pages.

(Continued)

*Primary Examiner* — Yogeshkumar Patel
(74) *Attorney, Agent, or Firm* — Frederick Hsu

(57) ABSTRACT

Apparatus and associated methods relate to providing a machine learning methodology that uses the machine learning's own failure experiences to optimize future solution search and provide self-guided information (e.g., the dependency and independency among various adaptation behavior) to predict a receiver's equalization adaptations. In an illustrative example, a method may include performing a first training on a first neural network model and determining whether all of the equalization parameters are tracked. If not all of the equalization parameters are tracked under the first training, then, a second training on a cascaded model may be performed. The cascaded model may include the first neural network model, and training data of the second training may include successful learning experiences and data of the first neural network model. The prediction accuracy of the trained model may be advantageously kept while having a low demand for training data.

20 Claims, 9 Drawing Sheets

(56) References Cited

OTHER PUBLICATIONS

Tektronix, Overcoming Receiver Test Challenges in Gen4 I/O Applications, n.d., [online], [retrieved on Sep. 2019]. Retrieved from the Internet <https://download.tek.com/document/65W_61045_0_Gen4Rx-Testing_AN.PDF>, 18 pages.

Tianjian Lu, Ju Sun, Ken Wu, Zhiping Yang, High-Speed Channel Modeling With Machine Learning Methods for Signal Integrity Analysis, IEEE Transactions on Electromagnetic Compatibility, Dec. 2017, 8 pages, USA.

Bowen Li, Paul Franzon, Yongjin Choi, Christopher Cheng, Receiver Behavior Modeling based on System Identification, IEEE, 2018, p. 299-301,3 pages, US.

Alex Manukovsky, Zurab Khasidashvili, Adam J Norman, Yaron Juniman, Roee Bloch, Machine Learning Applications for Simulation and Modeling of 56 and 112 Gb SerDes Systems, DesignCon 2019, 2019, [online], [retrieved on Sep. 2019]. Retrieved from the Internet <https://schedule.designcon.com/session/machine-learning-applications-for-simulation-modeling-of-56-112-gb-serdes-systems/859764>, 25 pages.

Francisco Elias Rangel-Patino, Jose Ernesto Rayas-Sanchez, Andres Viveros-Wacher, Jose Luis Chavez-Hurtado, Edgar Andrei Vega-Ochoa, Nagib Hakim, Post-Silicon Receiver Equalization Metamodeling by Artificial Neural Networks, IEEE Transactions on Computer-Aided Design of Integrated Circuits and Systems, vol. 38, No. 4, Apr. 2019, p. 733-740, 8 pages.

Tianjian Lu, Ken Wu, Machine Learning Methods in High-Speed Channel Modeling, DesignCon 2019, 2019, [online], [retrieved on Sep. 2019]. Retrieved from the Internet <https://schedule.designcon.com/session/machine-learning-methods-in-high-speed-channel-modeling/859113>, 15 pages.

\* cited by examiner

MACHINE LEARNING BASED METHODOLOGY FOR ADAPTATIVE EQUALIZATION

TECHNICAL FIELD

Various embodiments relate generally to integrated circuits (ICs) and, more particularly, to machine learning based method to predict a receiver's equalization codes.

BACKGROUND

Machine learning is the science of inducing computing systems to act without being explicitly programmed. Classical machine learning includes various clustering and classification techniques, including K-means clustering, linear and logistic regressions, stochastic gradient descent, association rule learning, and the like. Deep learning is a newer frontier in machine learning. Deep learning is a class of machine learning algorithms that uses multiple layers of nonlinear processing units for feature extraction and transformation. Deep learning algorithms can be unsupervised (e.g., pattern analysis) or supervised (e.g., classification). The deep learning algorithm can be implemented using layers of an artificial neural network (ANN) (referred to herein as a "neural network").

In general, a neural network is a collection of nodes (i.e., the "neurons") that are connected in a graph. A node in a neural network computes a sum of weighted inputs and adds an optional bias to the sum. The output of the node is a function of the final sum (referred to as an "activation function"). Example activation functions include the sigmoid function, the hyperbolic tangent (tan h) function, the Rectified Linear Unit (ReLU) function, and the identity function. Neural network models are often organized into layers of nodes, which define a specific topology, and corresponding weights and biases. The weights and biases are referred to as network parameters.

SUMMARY

Apparatus and associated methods relate to providing a machine learning methodology that uses the machine learning's own failure experiences to optimize future solution search and provide self-guided information (e.g., the dependency and independency among various adaptation behavior) to predict a high-speed SerDes receiver's equalization adaptations. In an illustrative example, a method may include performing a first training on a first neural network model and determining whether all of the equalization parameters are tracked. If not all of the equalization parameters are tracked under the first training, then, a second training on a cascaded model may be performed. The cascaded model may include the first neural network model and a second neural network model, and training data of the second training may include successful learning experiences and data of the first neural network model. The prediction accuracy of the trained model may be advantageously kept while having a low demand for training data.

Various embodiments may achieve one or more advantages. For example, some embodiments may include a model library. The model library may include different types of machine learning models (e.g., regression models) to be selectively trained. In some embodiments, several regression models may be cascaded. Based on the concatenation of several regressors, the cascaded model may use all information collected from the outputs of the previous regressors as additional information for the next model in the cascaded model. During the training, the model configuration may be updated, and different model types may be selected. Thus, the model may automatically optimize its learning process to track the SerDes receiver equalization parameter adaptations with high fidelity.

In some embodiments, a faster simulation speed may be obtained as the model may automatically optimize the future solution search and provide self-guided information. In some embodiments, as the training data includes the input waveforms to the receiver and corresponding equalization parameters, circuit design details are not necessary for the training. Thus, the design cycle to build a model may be advantageously reduced. The machine learning modeling may be a black-box modeling, and no substantial domain knowledge is needed. In some embodiments, the machine learning model may correct learning itself by learning from the previous training experience and then correcting its learning path. The modeling method may be applied to both pre-silicon circuit modeling simulations and post-silicon validation on-die measurements.

In one exemplary aspect, a system includes a processing engine and a data store coupled to the processing engine. The data store contains a program of instructions that, when executed by the processing engine, cause the processing engine to perform operations to predict equalization parameters for a receiver. The operations includes (a) retrieving, by the processing engine, a first set of pre-processed training data from the data store, (b) performing a first training on a first neural network model in response to the retrieved first set of pre-processed training data, (c) determining whether all of the equalization parameters are tracked under the first training, and, (d) if not all of the equalization parameters are tracked under the first training, then, preparing a second set of training data and performing a second training on a cascaded model, wherein the cascaded model comprises the first neural network model and a second neural network model, and the second set of training data comprises successfully predicted data generated by the first neural network model.

In some embodiments, the operations may also include (e) determining whether all of the equalization parameters are tracked under the second training, and if all of the equalization parameters are tracked, then, (f) checking whether the training on the cascaded model is converged or not. In some embodiments, the operations may also include (g) if the training on the cascaded model is converged, then, comparing corresponding equalization parameters predicted by the second neural network model with a second predetermined criteria to determine whether the predicted equalization parameters predicted by the second neural network are successful.

In some embodiments, the operations may also include retrieving, by the processing engine, a third set of pre-processed training data from the data store and training a second neural network model in response to the third set of pre-processed training data. In some embodiments, the operations may also include checking whether the training on the second neural network model is converged or not, and, if the training on the second neural network model is converged, then, comparing corresponding equalization parameters predicted by the second neural network model with a second predetermined criteria to determine whether the predicted equalization parameters predicted by the second neural network are successful and storing corresponding successfully predicted equalization parameters generated by the second neural network model. In some embodiments, the operations may also include checking whether the training on the first neural network model is converged if all of the equalization parameters are tracked under the first training. In some embodiments, the operations may also include, if the training on the first neural network model is converged, then, comparing corresponding equalization parameters predicted by the first neural network model with a first predetermined criteria to determine whether the predicted equalization parameters predicted by the first neural network are successful and storing corresponding successfully predicted equalization parameters generated by the first neural network model.

In some embodiments, the operations may also include, if the training on the first neural network model is not converged, then, increasing corresponding training iteration configuration of the first neural network model and recheck the convergency of the training on the first neural network model. In some embodiments, the pre-processed training data may include (i) training input data extracted from an input waveform received by the receiver and (ii) corresponding equalization parameters of the receiver in response to the input waveform. In some embodiments, the equalization parameters may include DFE taps and automatic gain control (AGC) codes.

In another exemplary aspect, a method to provide a trained model to predict a receiver's equalization parameters includes (a) retrieving a first set of pre-processed training data extracted from the receiver, (b) performing a first training on a first neural network model in response to the retrieved first set of pre-processed training data, (c) determining whether all equalization parameters of the receiver are tracked under the first training, and, (d) if not all equalization parameters are tracked under the first training, then, preparing a second set of training data and performing a second training on a cascaded model, wherein the cascaded model comprises the first neural network model and a second neural network model, and the second set of training data comprises successfully predicted data as the cascaded model's inputs.

In some embodiments, the method may also include (e) determining whether all equalization parameters are tracked under the second training, and (f) if all equalization parameters are tracked, then, checking whether the training on the cascaded model is converged or not.

In some embodiments, the method may also include (g) if the training on the cascaded model is converged, then, comparing corresponding equalization parameters predicted by the second neural network model with a second predetermined criteria to determine whether the predicted equalization parameters predicted by the second neural network are successful. In some embodiments, the method may also include retrieving a third set of pre-processed training data, and, training a second neural network model in response to the third set of pre-processed training data. In some embodiments, the method may also include checking whether the training on the second neural network model is converged or not, and, if the training on the second neural network model is converged, then, comparing corresponding equalization parameters predicted by the second neural network model with a second predetermined criteria to determine whether the predicted equalization parameters predicted by the second neural network are successful and storing corresponding successfully predicted equalization parameters generated by the second neural network model.

In some embodiments, the method may also include, if all equalization parameters are tracked under the first training, then, checking whether the training on the first neural network model is converged or not. In some embodiments, the method may also include, if the training on the first neural network model is converged, then, comparing corresponding equalization parameters predicted by the first neural network model with a first predetermined criteria to determine whether the predicted equalization parameters predicted by the first neural network are successful and storing corresponding successfully predicted equalization parameters generated by the first neural network model. In some embodiments, the method may also include, if the training on the first neural network model is not converged, then, increasing corresponding training iteration configuration of the first neural network model and recheck the convergency of the training on the first neural network model. In some embodiments, the method may also include extracting training input data extracted from an input waveform received by the receiver and corresponding equalization parameters of the receiver in response to the input waveform, and pre-processing the extracted training input data and corresponding equalization parameters. In some embodiments, the equalization parameters may include DFE taps and automatic gain control (AGC) codes.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to providing a machine learning methodology that uses the machine learning's own failure experiences to optimize future solution search and provide self-guided information (e.g., the dependency and independency among various adaptation behavior) to predict a high-speed SerDes receiver's equalization adaptations. In an illustrative example, a method may include performing a first training on a first neural network model and determining whether all equalization parameters are tracked. If not all equalization parameters are tracked under the first training, then, a second training on a cascaded model may be performed. The cascaded model may include the first neural network model and a second neural network model, and training data of the second training may include successful learning experiences and data of the first neural network model. The prediction accuracy of the trained model may be advantageously kept while having a low demand for training data.

To aid understanding, this document is organized as follows. First, an exemplary platform (e.g., an FPGA) suitable to perform data communication is briefly introduced with reference to FIG. 1. Second, with reference to FIGS. 2-3B, the discussion turns to an exemplary embodiment that illustrate a machine learning system implemented in a data communication system to perform a receiver's equalization parameters. Third, with reference to FIGS. 4-5, exemplary methods to generate a trained machine learning model to perform a receiver's equalization parameters are discussed. Then, with reference to FIG. 6, another exemplary architecture of a machine learning system is discussed. And, with reference to FIGS. 7A-7B, further explanatory discussion and simulation data are presented to explain several advantages of using the machine learning system. Finally, with reference to FIG. 8, another exemplary platform (e.g., a system-on-Chip (SOC)) suitable to perform data communication and waveform prediction is briefly introduced.

Figure 1:
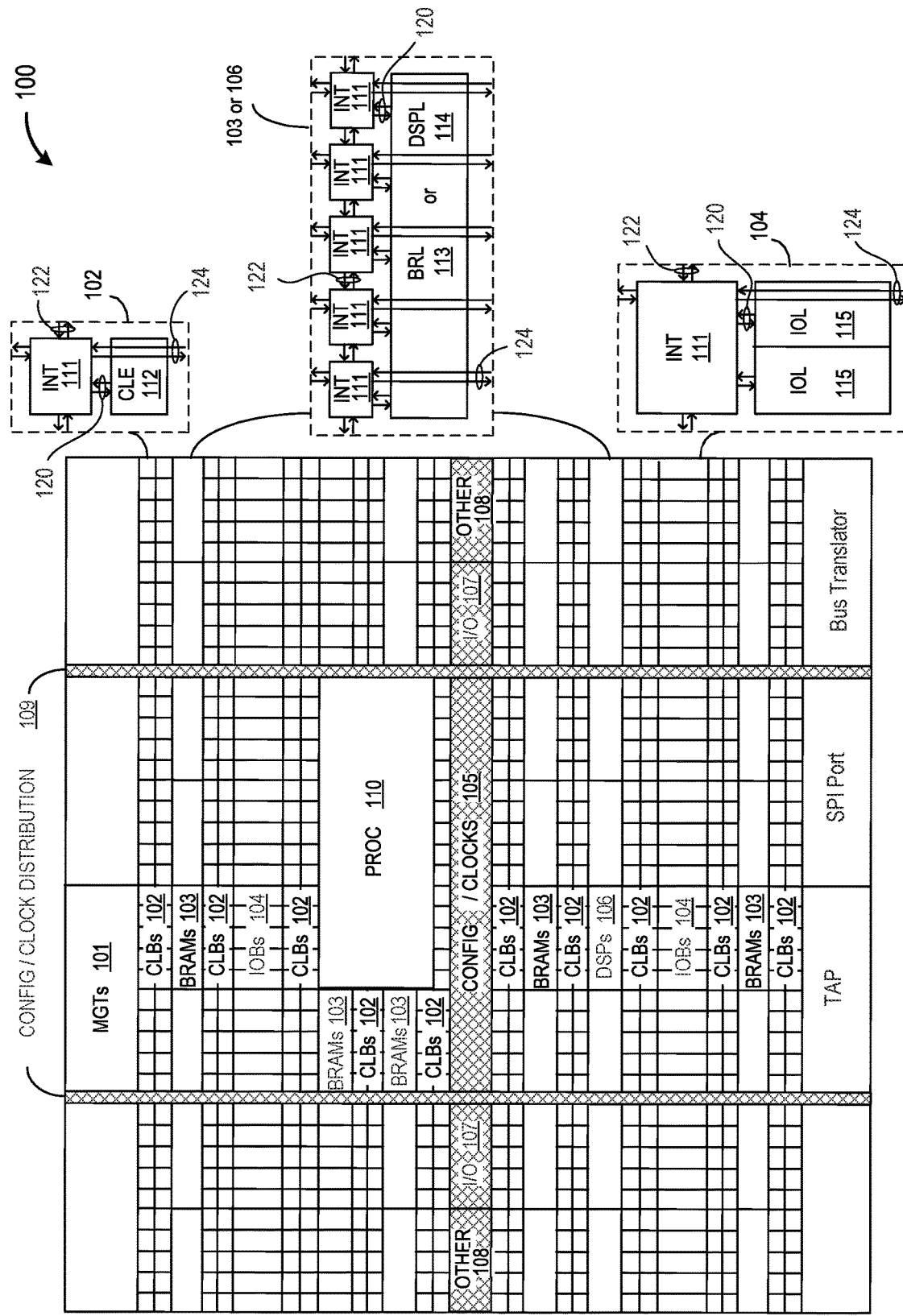
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

High-speed digital (HSD) integrated circuits (ICs) may be used in Serializer/Deserializer (SerDes) systems. In such systems, a lossy channel may exist between the transmitter circuit and the receiver circuit and at high data rates the received data stream may be severely distorted and require reconstruction (equalization) before use.

Figure 2:
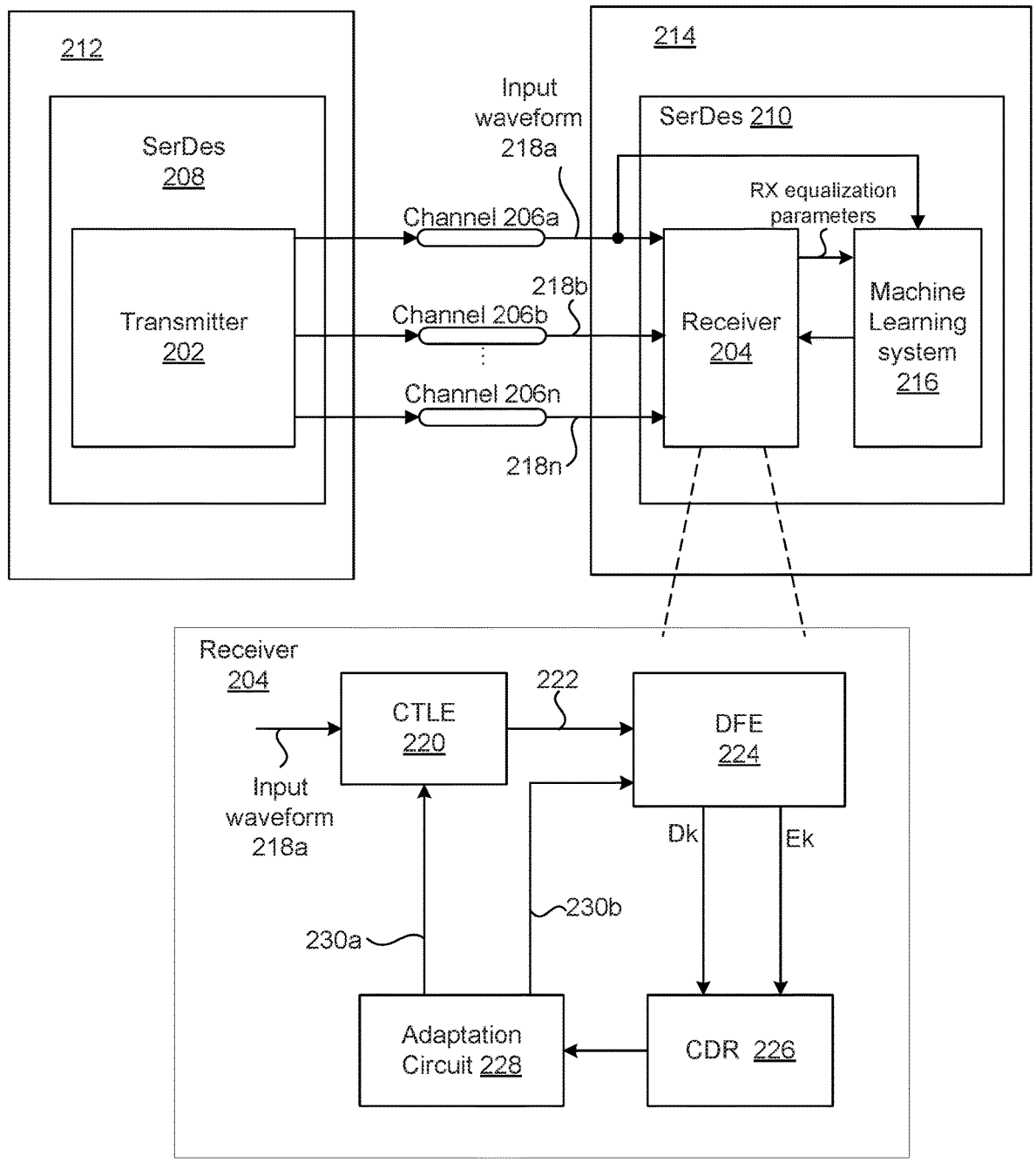
FIG. 2 depicts a communication system with an exemplary machine learning system implemented to predict a receiver's equalization adaptations.

FIG. 2 depicts a communication system with an exemplary machine learning system implemented to predict a receiver's equalization adaptations. In this depicted example, a serial communication system 200 includes a transmitter 202 coupled to a receiver 204 over one or more transmission channels 206*a*-206*n*. The transmitter 202 may be part of a serializer-deserializer (SerDes) 208 and the SerDes 208 is disposed in an integrated circuit (IC) 212. The receiver 204 may also be part of a SerDes 210 and the SerDes 210 is disposed in an IC 214. The SerDes 210 also includes a machine learning system 216 configured to receive training data (e.g., waveforms received by the receiver 204 and corresponding equalization parameters) and provide a trained machine learning model to predict receiver equalization adaptations in response to different test waveforms (e.g., input waveforms received by the receiver 204). A library may contain various regression models, different regression models may be selectively cascaded to get a more accurate prediction. Successfully predicted results of one model may be used in the training of another model. Thus, prediction accuracy may be advantageously kept while having a low demand for training data.

The transmission channels 206a-206n may include printed circuit board (PCB) traces, vias, cables, connectors, decoupling capacitors, and the like. The transmitter 202 drives serial data onto the transmission channels 206a-206n using a digital baseband modulation technique. In general, the serial data is divided into symbols. The transmitter 202 converts each symbol into an analog voltage mapped to the symbol. The transmitter 202 couples the analog voltage generated from each symbol to the one of the transmission channels 206a-206n. In some embodiments, the transmitter 202 may use a binary non-return-to-zero (NRZ) modulation scheme. In binary NRZ, a symbol may be one bit of the serial data and two analog voltages may be used to represent each bit. In some examples, the transmitter 202 may use multi-level digital baseband modulation techniques, such as pulse amplitude modulation (PAM), where a symbol includes a plurality of bits of the serial data and more than two analog voltages may be used to represent each bit.

The receiver 204 receives corresponding analog signals (e.g., input waveforms 218a-218n) from the transmission channels 206a-206n, respectively. The transmission channels 206a-206n may degrade the signal quality of the transmitted analog signals. Channel insertion loss is a frequency-dependent degradation in signal power of the analog signal. When signals travel through a transmission channel, the high-frequency components of the analog signal may be attenuated more than the low-frequency components. In general, channel insertion loss may increase as frequency increases. Signal pulse energy in the analog signal may be spread from one symbol period to another during propagation on the transmission channels 206a-206n. The resulting distortion is known as inter-symbol interference (ISI). A continuous time linear equalizer (CTLE) and/or a decision feedback equalizer (DFE) may be used to mitigate the ISI.

In this depicted example, the receiver 204 includes a CTLE 220. The CTLE 220 is coupled to receive a corresponding analog signal (e.g., the input waveform 218a) from the transmission medium 206a. The CTLE 220 may operate as a high-pass filter or band-pass filter to compensate for the low-pass characteristics of the transmission medium 206a. The peak of the frequency response of the CTLE 220 may be adjusted by an adaptation circuit 228.

The CTLE 220 outputs a first equalized analog signal 222. A decision circuit (e.g., decision feedback equalizer (DFE)) 224 is coupled to the output of the CTLE 220 and receives the first equalized analog signal 222. The decision circuit 224 may be operable to equalize the first equalized analog signal 222 to compensate for post-cursor ISI. In this depicted example, the decision circuit 230 may also include slicers (not shown). The slicers may sample the first equalized analog signal 222 to generate a data sample Dk and an error sample Ek per symbol k. Each of the slicers may sample its analog input signal using a sampling clock at the baud-rate (symbol rate) to generate the data and error samples. The data samples Dk may include estimated values for the symbols, and the error samples Ek may include estimated decision errors for the symbols. Each data sample Dk and each error sample Ek may include one or more bits depending on the type of modulation scheme employed (e.g., one-bit samples for binary NRZ and multi-bit samples for PAM). In some embodiments, the CTLE 220 may include an automatic gain control (AGC) circuit (not shown) configured to adjust a gain of the first equalized signal 222 based on a gain adjust signal provided by the adaptation circuit 228. In some embodiments, the AGC circuit may be coupled between the CTLE 220 and the DFE 224. In some embodiments, the AGC circuit may precede the CTLE 220.

In some embodiments, the receiver 204 may also include a deserializer (not shown) to group data samples Dk and error samples Ek to generate a deserialized signal to be processed by a clock-data recovery (CDR) circuit 226. The CDR circuit 226 outputs a data signal (e.g., include the data samples) to the adaptation circuit 228. The adaptation circuit 228 generates control signals 230a/230b for the CTLE 224 and the DFE 230 based on the data signal generated by the CDR circuit 226, using known algorithms.

In this depicted example, the input waveform 218a and corresponding receiver equalization parameters (e.g., AGC codes, DFE taps) are used as training data for neural network models. The trained models may be then able to predict receiver equalization parameters in response to different input waveforms and different SerDes channels (e.g., channels 206a-206n). Exemplary architectures of a machine learning system is described in further detail with reference to FIG. 3A and FIG. 6.

Figure 3A:
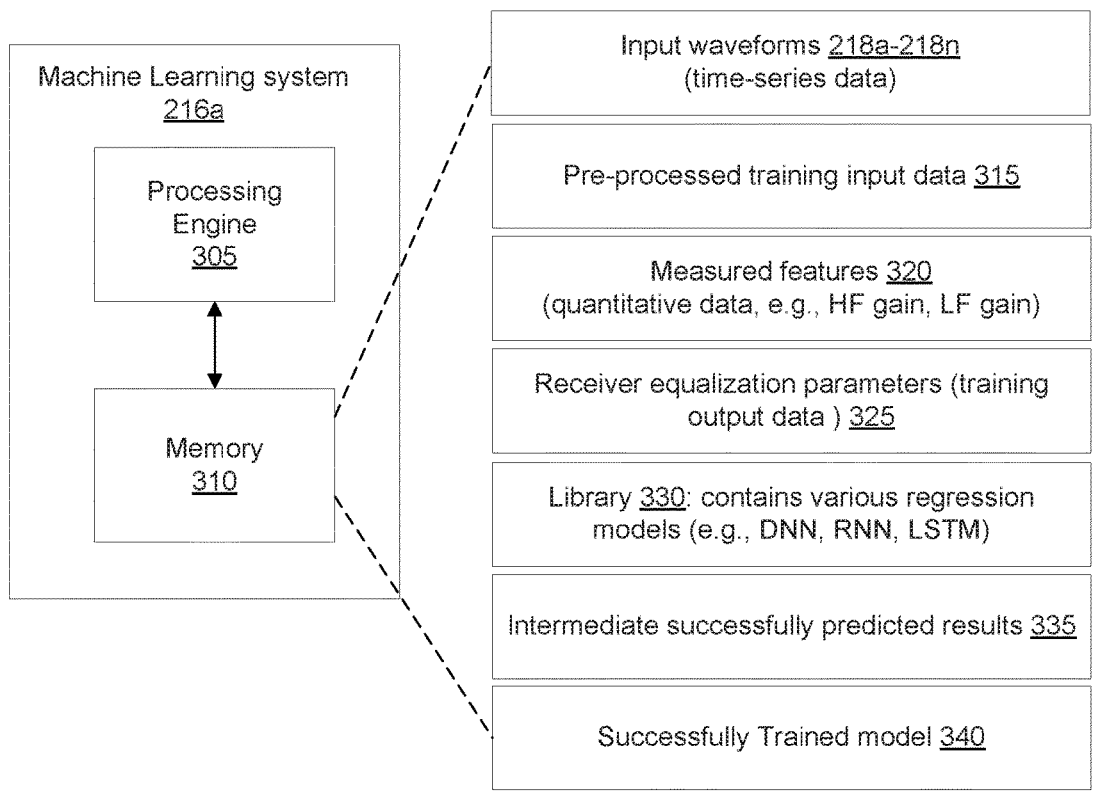
FIG. 3A depicts an exemplary architecture of the machine learning system.

FIG. 3A depicts an exemplary architecture of the machine learning system. In this depicted example, the machine learning system 216a includes a processing engine 305 coupled to a memory 310 (e.g., through an interface circuitry). The memory 310 may be considered an example of computer readable storage media. The processing engine 305 is configured to execute program code accessed from memory 310. Exemplary operations to be performed by the processing engine 305 is discussed in further detail with reference to FIG. 4.

Figure 3B:
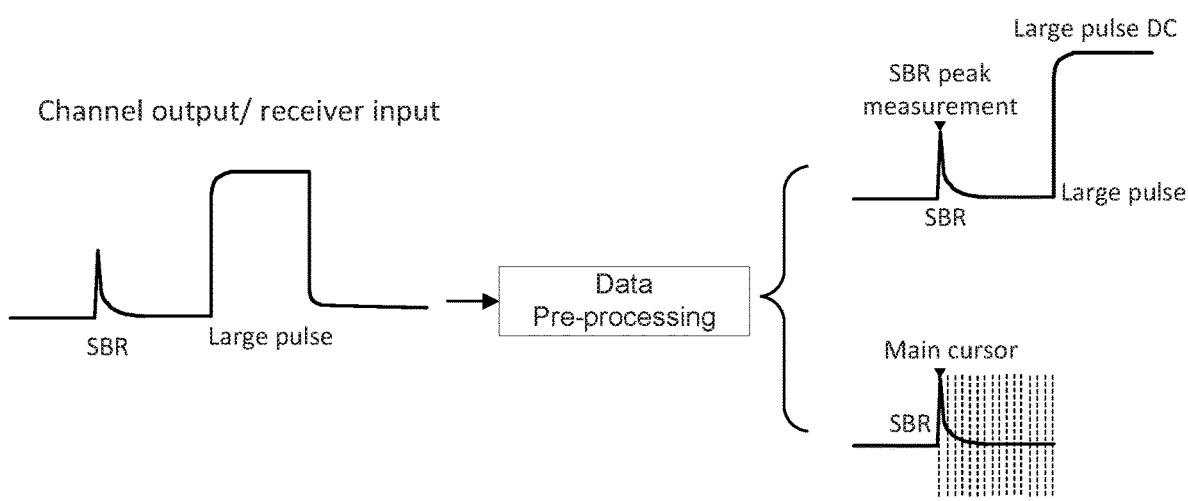
FIG. 3B depicts exemplary raw data and exemplary pre-processed data used by the machine learning system.

In this depicted example, except for program codes to be executed by the processing engine 305, the memory 310 also stores input waveforms 218a-218n to be received by the receiver 204. The input waveforms 218a-218n may be extracted from on-die measurements. Before training neural network models, the input waveforms 218a-218n may be pre-processed. The pre-processed training input data 315 may also be stored in the memory. An exemplary input waveform and corresponding pre-processed training input data are shown in FIG. 3B. In some embodiments, some features of the receiver 206 may be measured. For example, the high frequency gain and low frequency gain of amplifiers in the receiver 206. The measured features 320 may also be stored in the memory 310.

The input waveform 218a provides maximum information that are enough for the receiver adaptation. After the adaptation codes are stables, receiver equalization parameters 325 (e.g., CTLE and DFE parameters) after adaptation are collected. In this depicted example, the receiver equalization parameters 325 are also stored in the memory 310. In this depicted example, the input waveform 218a and corresponding receiver equalization parameters 325 are used as training data for neural network models.

The processing engine 305 is configured to perform machine learning (e.g., neural network training) using the pre-processed training input data 315 and the corresponding receiver equalization parameters 325 to generate a trained machine learning model. In this depicted example, the memory 310 also includes a library 330. The library 330 contains various regression models. For example, deep neural network based (DNN) models, recurrent neural network (RNN) based models, long short-term memory (LSTM) based models. The processing engine 305 may determine to select which model(s) to use, whether to improve the model configuration and/or whether to change a different model type.

Successful machine learning experience and data (e.g., well-predicted data) 335 may be stored in the memory 310. Cascading technique may be used to combine information from multiple predictive models to het a more accurate prediction. Based on the concatenation of several regressors, a cascaded model may use all information collected from the outputs from previous regressors as additional information for the next model in the cascaded structure. The processing engine 305 may also select several models and cascade the selected models to from a cascaded model. The successful learning experience and data 335 may also be used to train the cascaded model. Successfully trained model (include the cascaded model) 340 is then stored in the memory 310. The processing engine 305 may then use the successfully trained model 340 to predict receiver equalization parameters. Exemplary operations to be performed by the processing engine 305 is discussed in further detail with reference to FIG. 4.

The memory 310 may include one or more physical memory devices such as, for example, a local memory and one or more bulk storage devices. Local memory refers to random access memory (RAM) or other non-persistent memory devices generally used during actual execution of the program code. A bulk storage device may be implemented as a hard disk drive (HDD), solid state drive (SSD), or other persistent data storage device. The machine learning system 230 may also include one or more cache memories (not shown) that provide temporary storage of at least some program codes in order to reduce the number of times program codes to be retrieved from the bulk storage device during execution. Although, in this depicted example, the input waveforms 218a-218n, the corresponding pre-processed training input data 315, the library 330 of machine learning models are all stored in the same memory 310, in some embodiments, part or all of the contents may be stored in different data storages.

FIG. 3B depicts exemplary raw data and exemplary pre-processed data used by the machine learning system. An input waveform (e.g., the input waveform 218a) measured at the receiver's input is shown. The input waveform 218a provides maximum information that are enough for the receiver adaptation. In this depicted example, the input waveform 218a includes a single-bit response (SBR) and a long pulse response (e.g., large pulse). The processing engine 305 retrieves the input waveform 218a from the memory 310 and then pre-processes the retrieved input waveform 218a. For example, the processing engine 305 measures the peak value of the SBR pulse and the DC value of the large pulse. The peak difference between the SBR pulse and the large pulse will be used to train a model for CTLE equalization prediction. The processing engine 305 also process the input waveform 218a by regarding the SBR pulse as main cursor and slicing the subsequent values into many unit intervals (UIs). Each UI may match to a post cursor of the DFE. The post cursors will be used to train a model for DFE equalization prediction. Test waveforms (e.g., input waveforms 218b-218n) may also be pre-processed in the same way and stored in the memory 310.

Figure 4:
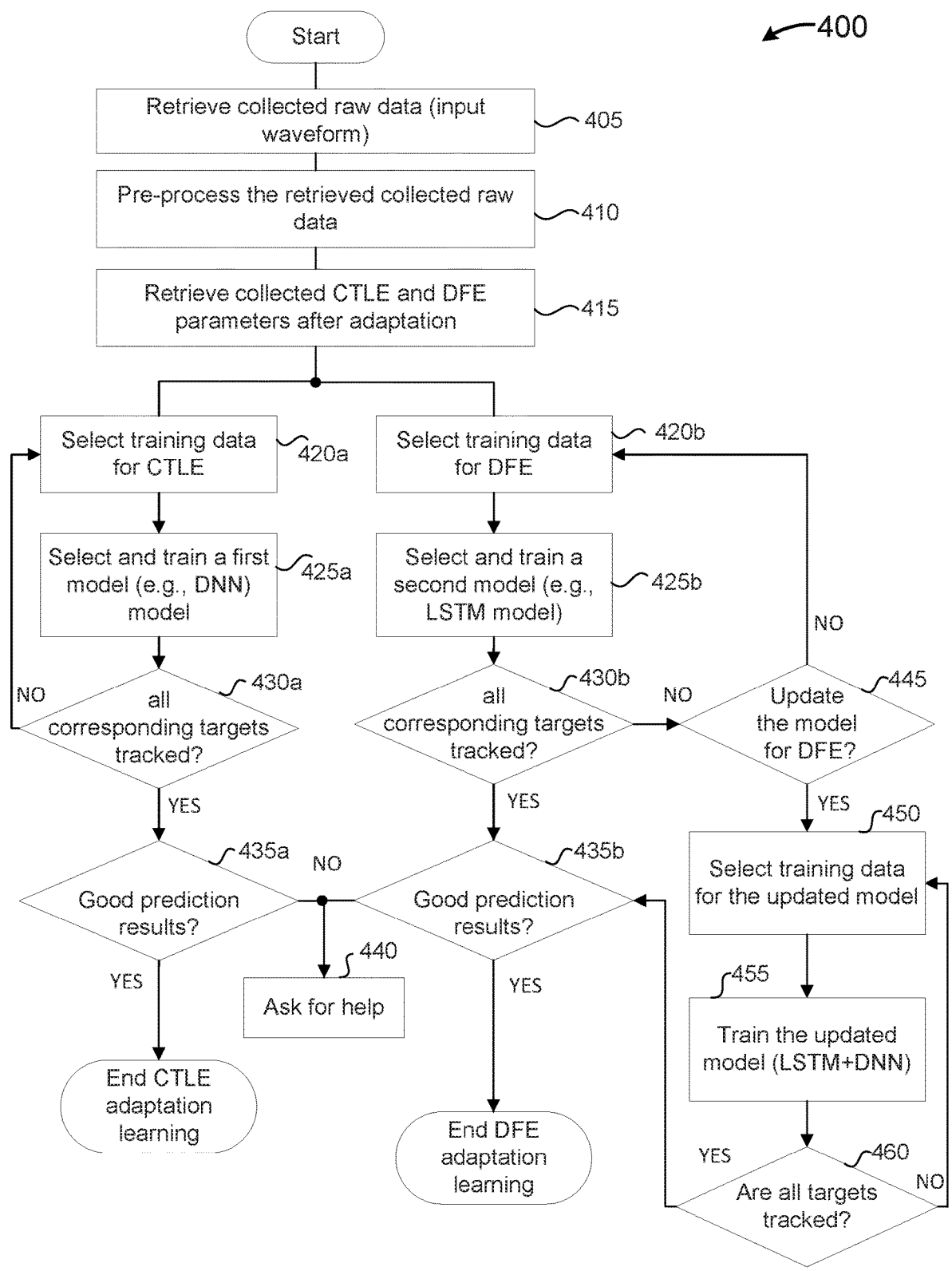
FIG. 4 depicts a flow chart of an exemplary method to provide a trained neural network model for a receiver equalization parameter prediction.

FIG. 4 depicts a flow chart of an exemplary method to provide a trained neural network model for a receiver's equalization parameter prediction. An exemplary method 400 to provide a trained neural network model for equalization parameter prediction of a receiver (e.g., the receiver 204) includes, at 405, retrieving (e.g., by the processing engine 305) collected raw data (e.g., the input waveform 218a) and, at 410, pre-processing (e.g., clean, normalize) the retrieved collected raw data to obtain training input data (e.g., the peak difference and the post cursor as shown in FIG. 3B) for CTLE (e.g., CTLE 220) and/or DFE (e.g., DFE 224). The method 400 also includes, at 415, retrieving (e.g., by the processing engine 305) receiver equalization parameters (e.g., CTLE and/or DFE adaptation codes) in response to the input waveform 218a. The pre-processed raw data (e.g., training input data) and the receiver equalization parameters (e.g., training output data) may be then used as training data. In some embodiments, other parameters (e.g., high frequency gain, low frequency gain) of the receiver may also be used as training input data.

In this depicted example, the receiver includes both CTLE and DFE, thus, the prediction of equalization parameters include predicting both CTLE equalization parameters and DFE parameters. The method 400 also includes, at 420a, selecting (e.g., by the processing engine 305) training data (e.g., peak differences and corresponding CTLE adaptation codes) used for predicting CTLE equalization parameters and, at 420b, selecting training data (e.g., post cursors and corresponding DFE taps) used for predicting DFE equalization parameters. The selected training data may be only a portion of the whole training data available for training.

The method 400 also includes, at 425a, selecting (e.g., by the processing engine 305) a first regression model (e.g., DNN) from the library 330 and training the first regression model in response to corresponding selected training data of CTLE. The method 400 also includes, at 425b, selecting a second regression model (e.g., RNN or LSTM) from the library 330 and training the second regression model in response to corresponding selected training data of DFE. In some embodiments, the first regression model and/or the second regression model may perform self-configuration. For example, the first regression model and/or the second regression model may use Bayesian Optimization to automatically optimize its model configurations (e.g., the number of neurons in each neural networks layer).

The method 400 also includes, at 430a, determining whether all targets (e.g., adaptation codes or equalization parameters) of the CTLE are tracked, and at 430b, determining whether all targets (e.g., adaptation codes or equalization parameters) of the DFE are tracked. If a predicted target shows high correlation with a real value, that means the target is tracked.

If not all targets of the CTLE are tracked, then, the method 400 loops back to 420a and the processing engine 305 reselects the training data used for predicting CTLE equalization parameters. In some embodiments, the first regression model may also be changed to another regression model in the library 330. In some embodiments, more training data may be used in the first regression model's training. In some embodiments, if not targets of the CTLE are tracked, the processing engine 305 may also be configured to perform operations to make the first regression model (e.g., DNN) do optimization itself to find a model configuration by using optimization algorithms.

If all targets of the CTLE are tracked, then, at 435a, the processing engine 305 determines whether the trained first regression model has a good prediction behavior. For example, the processing engine 305 may retrieve test data and use the trained first regression model to predict corresponding CTLE equalization parameters. For example, ground-truth targets may be used to test the model prediction accuracy. Those testing data may be hidden during the model training process. The predicted CTLE equalization parameters may be then compared with corresponding actual CTLE equalization parameters. If the deviation between the predicted result and the actual result is below a predetermined threshold (e.g., ±1 code deviation, ±2 codes deviation, for example), then the predicted result may be regarded as good, and the CTLE adaptation learning may be ended. If the predicted results are not good, then the processing engine 305 may be configured to indicate the learning is not good. For example, the processing engine 305 may enable a user interface to indicate the learning result and ask for user help.

If all targets of the DFE are tracked, then, at 435b, the processing engine 305 determines whether the trained second regression model has a good prediction behavior. And if the predicted result may be regarded as good, the DFE adaptation learning may be ended. If the predicted results are not good, then the processing engine 305 may be configured to indicate the learning is not good. For example, the processing engine 305 may enable a user interface to indicate the learning result and ask for user help.

If not all targets of the DFE are tracked, then, the processing engine 305 determines whether to update the second regression model. For example, if the LSTM model prediction results are not good enough (e.g., lower than a predetermined accuracy level), the second regression model may be updated (for example, to an RNN model or a cascaded model). In some embodiments, accuracy requirements may be predetermined, and the predicted targets may be compared with pre-set accuracy thresholds to determine whether all the targets meet pre-set accuracy requirements If the second regression model is not to be updated (e.g., use the same model for DFE equalization parameters prediction), then, the method loops back to 420b and the processing engine 305 reselects the training data used for the second regression model. More training data may also be used in the second regression model's training. The processing engine 305 may send the targets that have accuracies below the thresholds to the next stage prediction. Different targets may have different pre-set accuracy thresholds. In some embodiments, if not targets of the DFE are tracked, the processing engine 305 may also be configured to perform operations to make the second regression model (e.g., DNN) do optimization itself to find a model configuration by using optimization algorithms.

If the second regression model is to be updated (e.g., change to a different model), then, at 450, the processing engine 305 selects training data used for the updated model. Although not all targets of the CTLE or the DFE are tracked, the trained first regression model and the trained second regression model may still have some previous successfully predicted results. The previous successfully predicted results may be also selected and used as a part of the training data for the updated model. For example, if a first target and a second target are well predicted, the related predicted results (and corresponding training data) may be stored in the memory 310. The processing engine 305 may select whether to use the first target related predicted results or the second target related predicted results or both.

The method 400 also includes, at 455, training the updated model in response to the corresponding selected training data (e.g., CTLE training data, DFE training data, previously successfully predicted results). In some embodiments, the updated model may be a regression model that is different from the second regression model. In some embodiments, the updated model may be formed by cascading two or more regression models. For example, the updated model may be formed by cascading the second regression model with another regression model (e.g., the first regression model). Based on the concatenation of several regressors, the updated model may use all information collected from the outputs from previous regressors as additional information for the next model in the cascaded model. Thus, the successful learning experiences and data may be used to train the model itself for the unknown parts that failed in the previous level. Accordingly, a model that has a reduced demand of training data may be obtained, while substantially keeps the prediction accuracy of the model.

Figure 5:
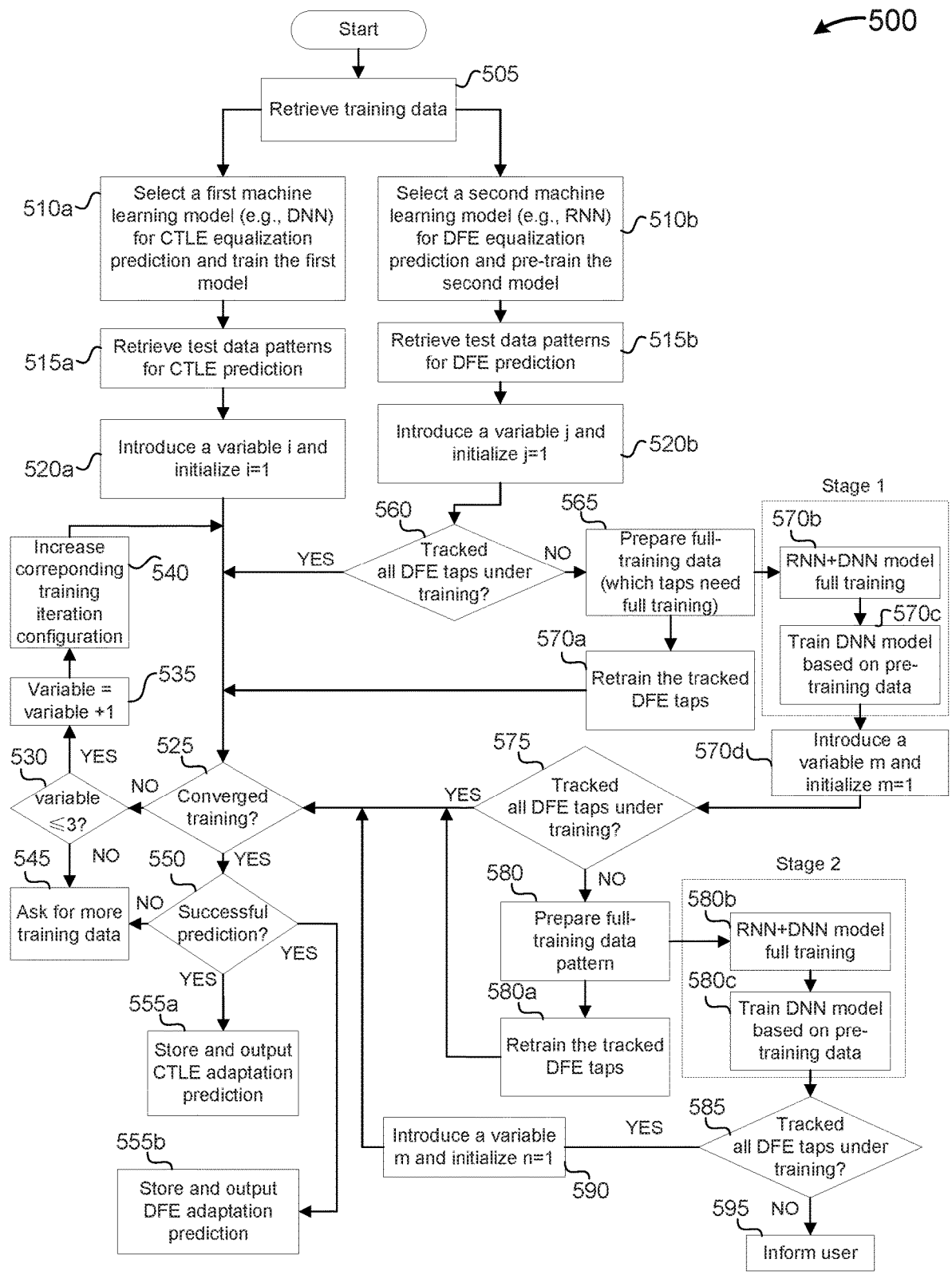
FIG. 5 depicts a flow chart of another exemplary method to provide a trained neural network model for a receiver equalization parameter prediction.

FIG. 5 depicts a flow chart of another exemplary method to provide a trained neural network model for a receiver's equalization parameter prediction. Another exemplary method 500 to provide a trained neural network model includes, at 505, retrieving (e.g., by the processing engine 305) training data (e.g., the pre-processed training input data of the input waveform 218a and receiver equalization parameters in response to the input waveform 218a).

The method 500 also includes, at 510a, selecting (e.g., by the processing engine 305) a first machine learning model and training the first machine learning model for predicting CTLE equalization parameters and, at 510b, selecting a second machine learning model and performing a preliminary training on the second machine learning model for predicting DFE equalization parameters. The method 500 also includes, at 515a and 515b, retrieving a first set of test data for the first machine learning model and retrieve a second set of test data for the second machine learning model, respectively. The method 500 also includes, at 520a and 520b, retrieving a variable i and initialize the variable i to 1, and retrieving a variable j and initialize the variable j to 1, respectively.

The method 500 also includes, at 525, determining whether the algorithms of the first machine learning model are converged or not. If the algorithms of first machine learning are not converged, then, at 530, the processing engine 305 determines the variable i is less than a predetermined number. For example, if the variable i is less than or equal to, for example, 3, then, the processing engine 305 increments the variable i and also increases corresponding training iteration configuration of the first machine learning model and loops back to 525. If the variable i is larger than 3, then, at 545, the processing engine 305 generates a signal to ask for more training data.

If the algorithms of first machine learning are converged, then, at 550, the processing engine 305 checks the prediction accuracy and determines whether the trained first machine learning model performed the prediction successfully. If the prediction of the first machine learning model doesn't meet a predetermined prediction accuracy, then, the method 500 loops back to 545. If the prediction of the first machine learning model meets the predetermined prediction accuracy, then, at 555a, the processing engine 305 outputs CTLE adaptation prediction results. The CTLE adaptation prediction results may also be stored in the memory 310.

The method 500 also includes, at 560, determining whether all DFE taps under training are tracked or not. If all DFE taps under training are tracked, then, the method 500 loops back to 525 and then corresponding condition for variable j is used to determine when to stop the convergency test. If the algorithms are converging and the prediction is successful, then, at 555b, the processing engine 305 outputs DFE adaptation prediction results. The DFE adaptation prediction results may also be stored in the memory 310. When both CTLE adaptation learning and the DFE adaptation learning are finished, a successfully trained model that is able to predict receiver equalization parameters is then available.

If, at 560, not all DFE taps under training are tracked, then, at 565, the processing engine 305 prepares full training data to train untracked DFE taps. The targets, which have lower prediction accuracies than pre-set thresholds, may need a full training. In some embodiments, the difference between the full training and the pre training may be the training data. For example, preliminary training may use measured data as model inputs. Full-training may use successfully predicted data as model inputs. The full training data, which may come from previous training data and successfully predicted targets, are the training data for the rest targets. The method 500 also includes, at 570a, retraining the tracked DFE taps to make sure the tracked DFE taps are solid and stable. The method 500 then loops back to 525 to check the convergency of algorithms in the training.

The method 500 also includes building a first stage (stage 1) to further improve the training speed. For example, the method 500 also includes, at 570b, performing a full training on a cascaded model in response to the prepared full training data. The cascaded model is obtained by cascading the first machine learning model (e.g., DNN) to the second machine learning model (e.g., RNN). Then, at 570c, the second machine learning model is trained in response to the successfully prediction results obtained in the preliminary training. Based on the concatenation of several regressors, the updated model may use all information collected from the outputs from previous regressors as additional information for the next model in the cascaded model. Thus, the successful learning experiences and data may be used to train the model itself for the unknown parts that failed in the previous level.

The method 500 also includes, at 570d, introducing a variable m and initialize the variable m to 1. Then, at 575, whether all DFE taps under training are tracked is checked. If all DFE taps under training are tracked, then, the method loops back to 525 and the convergency of algorithms in this training is checked. If all DFE taps under training are tracked, then the processing engine 305 checks convergency of algorithms and determines whether the trained second machine learning model performed the prediction successfully. A predetermined corresponding condition for variable m is used to determine when to stop the convergency test. If the algorithms are converging and the prediction is successful, then, at 555b, the processing engine 305 outputs DFE adaptation prediction results. The DFE adaptation prediction results may also be stored in the memory 310.

If, at step 575, not all DFE taps under training are tracked, then, at 580, the processing engine 305 prepares full training data to train untracked DFE taps. In this step, the full training data may be the previous successfully predicted targets (e.g., CTLE codes and high-accuracy DFE taps). For example, the model inputs may be the previous successfully predicted targets, and the model outputs may be the rest unsuccessfully predicted DFE taps. The method 500 also includes, at 580a, retraining the tracked DFE taps to make sure the tracked DFE taps are solid and stable. The method 500 then loops back to 525 to check the convergency of algorithms in the training.

The method 500 may also include building a second stage (stage 2) to further improve the training speed. For example, the method 500 also includes, at 580b, performing a full training on a cascaded model in response to the prepared full training data. In the first stage, the training data may include multiple data types (e.g., quantitative data and time series data). DNN and RNN model may be used. In the second stage, only pre-training data may be used. As those pre-training data are quantitative data, only DNN model may be used. Then, at 580c, the second machine learning model is trained in response to the successfully prediction results obtained in the preliminary training. Then, at 585, whether all DFE taps under training are tracked is determined. If all DFE taps under training are tracked, then, the method 500 includes, at 590, introducing a variable n and initialize the variable n to 1, and loops back to 525 to check the convergency of algorithms in this training. A predetermined corresponding condition (e.g., n≤3) for variable n is used to determine when to stop the convergency check and ask for help. If all DFE taps under training are still not tracked, then, the method 500 includes, at 595, informing a user to determine whether to introduce more stages. Thus, this machine learning methodology may use its own failure experience to optimize its future solution search and provide self-guided information such as the dependency among various adaptation behaviors. Accordingly, a model that has a reduced demand of training data may be obtained, while substantially keeps the prediction accuracy of the model.

Figure 6:
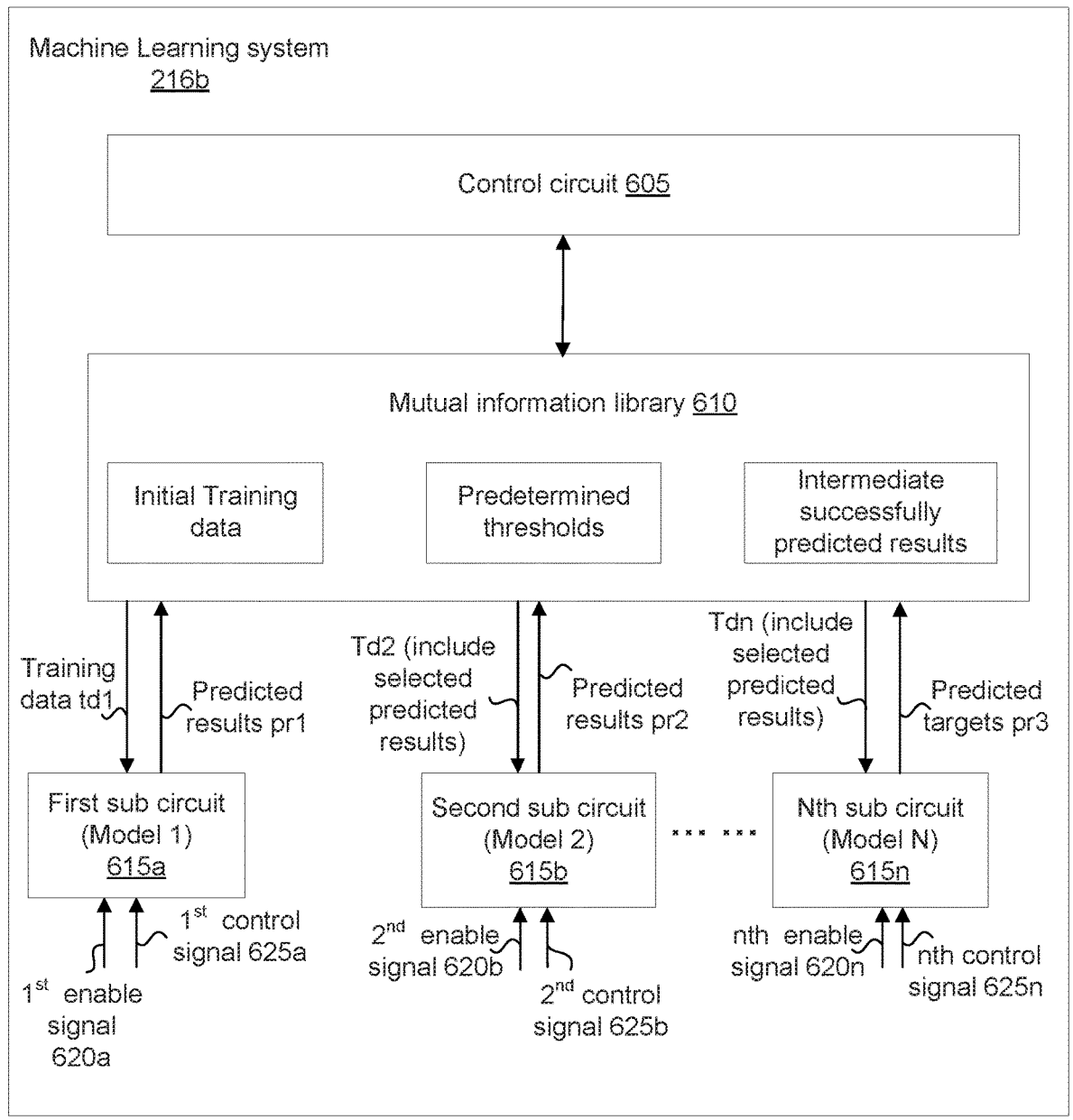
FIG. 6 depicts another exemplary architecture of the exemplary machine learning system.

FIG. 6 depicts another exemplary architecture of the exemplary machine learning system. In this depicted example, a machine learning system 216b includes a control circuit 605. The control circuit 605 controls the selection of training models, whether to improve model configuration, whether to add more training data, whether to try a different model type, and whether to add another level model, for example.

The machine learning system 216b also includes a mutual information library 610 configured to store and provide different information. For example, the mutual information library 610 may include initial training data. The initial training data may include the pre-processed training input data (e.g., information extracted from the input waveform 218a), the measured features of the receiver, and the corresponding training output data (e.g., the receiver equalization parameters in response to the input waveform 218a). The mutual information library 610 may also store some predetermined thresholds. For example, the mutual information library 610 may store thresholds used to determine the production accuracies of the machine learning models. The mutual information library 610 also stores intermediate successfully predicted results. For example, a first machine learning model may successfully predict the first tap and second tap of the DFE. The successfully predicted values may be then stored in the mutual information library and used in later training process.

The machine learning system 216b also includes a number of sub circuits 615a-615b configured to implement different machine learning models. For example, a first sub circuit 615a may be configured to implement a first regression model (e.g., DNN), and a second sub circuit 615b may be configured to implement a second regression model (e.g., RNN). Each sub circuit of these sub circuits may be enabled or disabled in response to a corresponding enable signal 620a-620n. For example, the control circuit 605 may generate a first enable signal 620a to train the first sub circuit 620a for a receiver's equalization parameters prediction. For example, the enabled sub circuit 615a then receives training data td1 from the mutual information library 610. The predicted results pr1 generated by the trained model are then compared with predetermined thresholds, and only successfully predicted results will be stored in the mutual information library 610 (e.g., the intermediate successfully predicted results). In some embodiments, based on the prediction results, the control circuit 605 may determines whether to enable another sub circuit (e.g., the second sub circuit 615*b*) and/or disable the current enabled sub circuit (e.g., the first sub circuit 615*a*).

The initial training data and the successfully predicted results may be then used to train the regression model in the second sub circuit 615*b*. In some embodiments, only a portion of the successfully predicted results may be used by the second sub circuit 615*b*. The control circuit 605 may also control whether to cascade different machine learning models and select the types of models to be cascaded.

The control circuit 605 also generates a number of control signals 625*a*-625*n* for these sub circuits 615*a*-615*n*, respectively. The training iteration configuration of a sub circuit may be incremented in response to the corresponding control signal. When both CTLE adaptation learning and the DFE adaptation learning are finished, a successfully trained model that is able to predict receiver equalization parameters is then available. Based on the concatenation of several regressors, the updated model may use all information collected from the outputs from previous regressors as additional information for the next model in the cascaded model. Thus, the successful learning experiences and data may be used to train the model itself for the unknown parts that failed in the previous level.

Figure 7A:
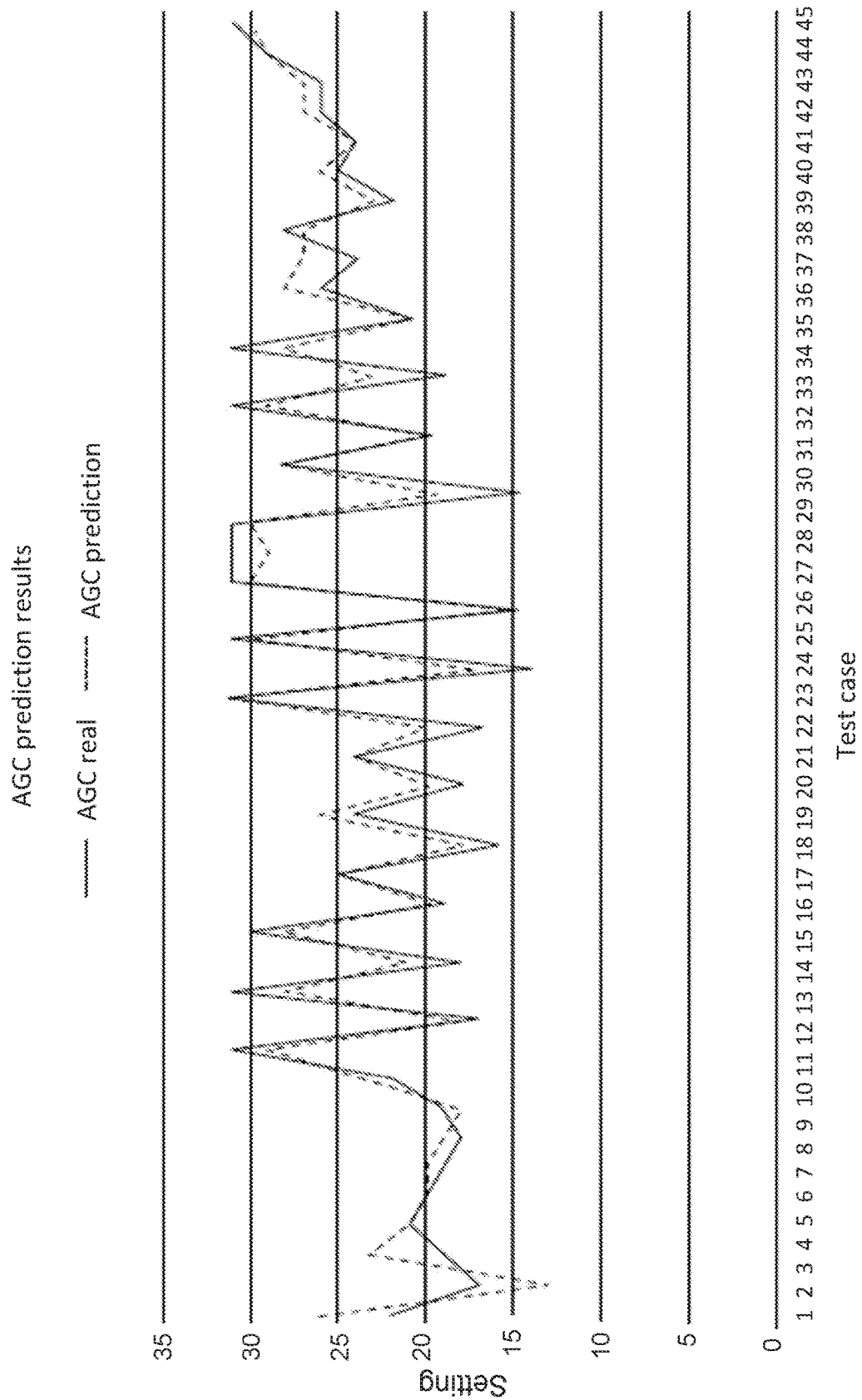
FIG. 7A depicts a simulation result showing actual automatic gain control (AGC) codes and predicted AGC codes.
Figure 7B:
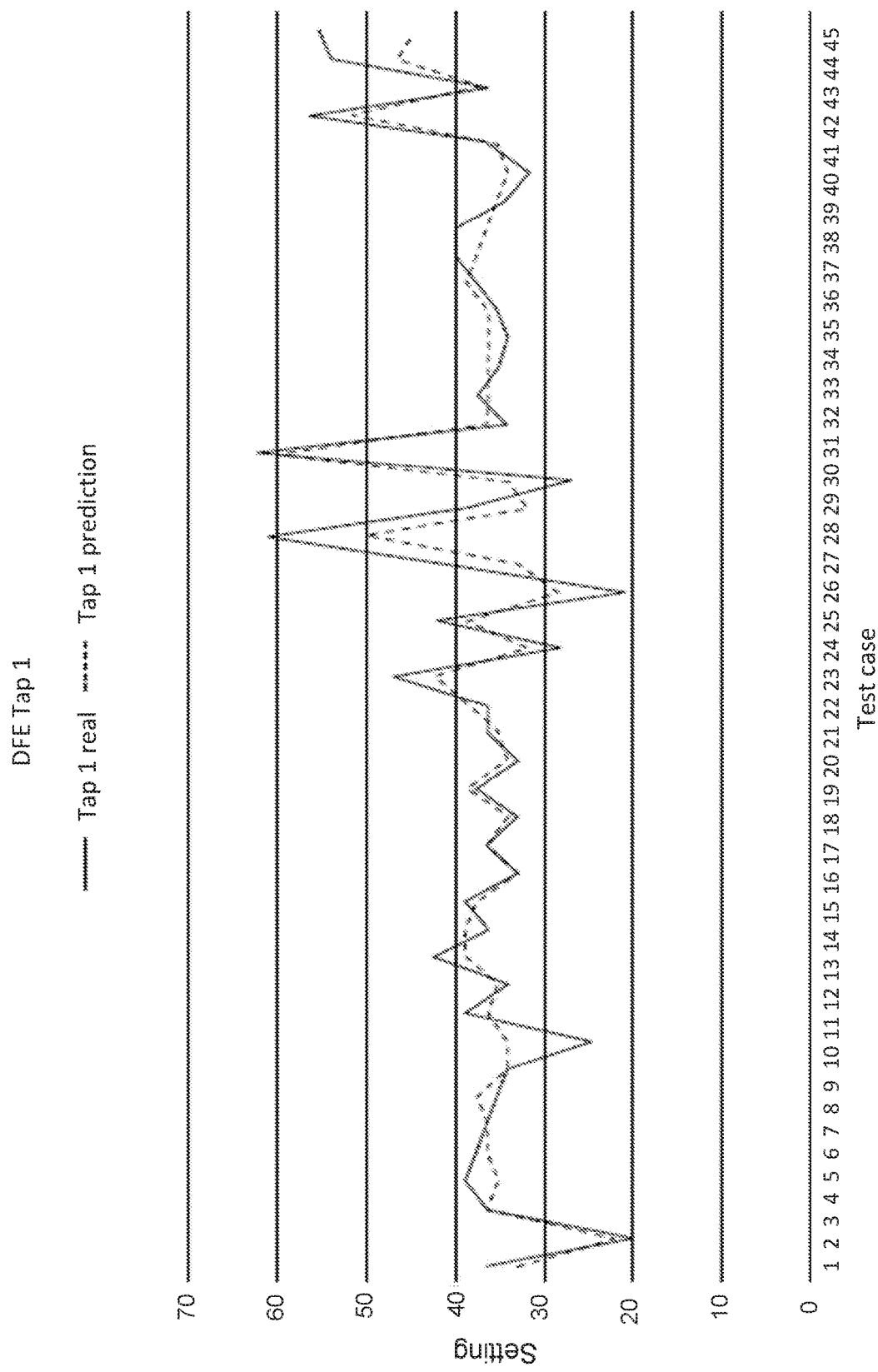
FIG. 7B depicts a simulation result showing actual decision feedback equalizer (DFE) taps and predicted DFE taps.

FIG. 7A depicts a simulation result showing actual automatic gain control (AGC) codes and predicted AGC codes. In this depicted example, the prediction result of the AGC code is shown. FIG. 7B depicts a simulation result showing actual decision feedback equalizer (DFE) taps and predicted DFE taps. In this depicted example, the prediction result of the first tap of the DFE is shown.

In the described example with reference to FIG. 2, the machine learning system 216 is arranged on the same IC (e.g., FPGA) with the receiver 204. In another embodiment, the machine learning system 216 may be implemented in a different IC (e.g., another FPGA).

In some embodiments, the machine learning system 216 may be implemented as hard block fixed circuitry. For example, an application specific integrated circuit (ASIC) may provide a machine learning system to predict receiver equalization parameters with customized hardware circuitry.

In some embodiments, some or all of the functions of the machine learning system (e.g., the machine learning system 216*a*) may be implemented in a processor (e.g., the processing engine 305) that is configured to execute a set of instructions stored in a data store to predict receiver equalization parameters. The processor may be arranged on the same integrated circuit, which may be an FPGA, with the receiver 204. For example, the machine learning system 216*a* and the data store (e.g., memory 310) may be implemented in a programmable logic block of a system-on-chip (SOC) or implemented in a hard block using fixed circuitry of the SOC, and the receiver 204 may be implemented in another hard block using, for example, fixed circuitry of the SOC.

Figure 8:
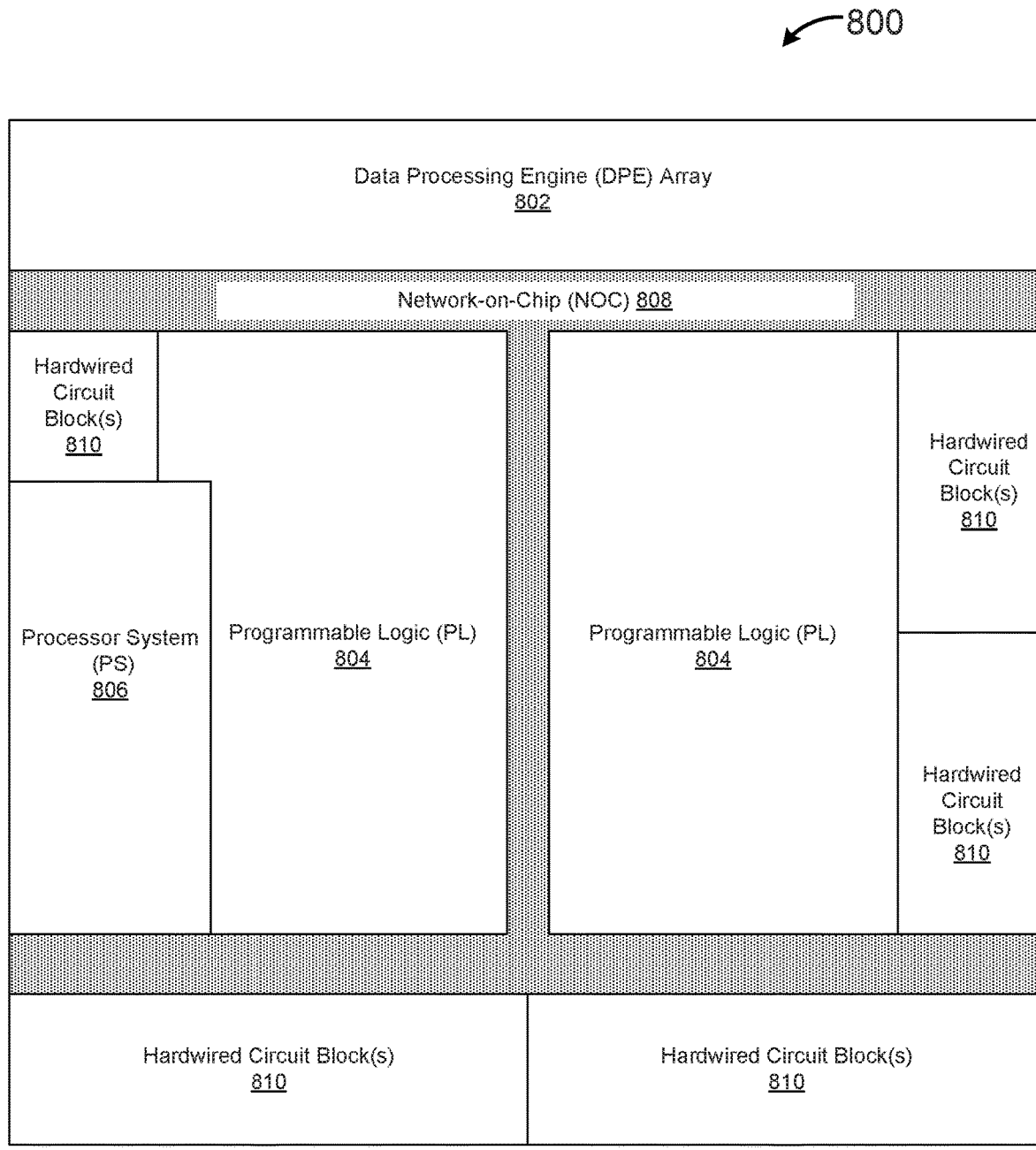
FIG. 8 illustrates an exemplary system-on-chip (SOC) on which the disclosed circuits and processes may be implemented.

FIG. 8 illustrates an exemplary system-on-chip (SOC) on which the disclosed circuits and processes may be implemented. SOC 800 is an example of a programmable IC and an integrated programmable device platform. In the example of FIG. 8, the various, different subsystems or regions of the SOC 800 illustrated may be implemented on a single die provided within a single integrated package. In other examples, the different subsystems may be implemented on a plurality of interconnected dies provided as a single, integrated package.

In the example, the SOC 800 includes a plurality of regions having circuitry with different functionalities. In the example, the SOC 800 optionally includes a data processing engine (DPE) array 802. SOC 800 includes programmable logic (PL) regions 804 (hereafter PL region(s) or PL), a processing system (PS) 806, a Network-on-Chip (NOC) 808, and one or more hardwired circuit blocks 810. DPE array 802 is implemented as a plurality of interconnected, hardwired, and programmable processors having an interface to the other regions of the SOC 800.

PL 804 is circuitry that may be programmed to perform specified functions. As an example, PL 804 may be implemented as field programmable gate array type of circuitry. PL 804 can include an array of programmable circuit blocks. Examples of programmable circuit blocks within PL 804 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 804 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 806 is implemented as hardwired circuitry that is fabricated as part of the SOC 800. The PS 806 may be implemented as, or include, any of a variety of different processor types each capable of executing program code. For example, PS 806 may be implemented as an individual processor, e.g., a single core capable of executing program code. In another example, PS 806 may be implemented as a multicore processor. In still another example, PS 806 may include one or more cores, modules, co-processors, interfaces, and/or other resources. PS 806 may be implemented using any of a variety of different types of architectures. Example architectures that may be used to implement PS 806 may include, but are not limited to, an ARM processor architecture, an x86 processor architecture, a GPU architecture, a mobile processor architecture, a DSP architecture, or other suitable architecture that is capable of executing computer-readable instructions or program code.

NOC 808 includes an interconnecting network for sharing data between endpoint circuits in SOC 800. The endpoint circuits can be disposed in DPE array 802, PL regions 804, PS 806, and/or in hardwired circuit blocks 810. NOC 808 can include high-speed data paths with dedicated switching. In an example, NOC 808 includes horizontal paths, vertical paths, or both horizontal and vertical paths. The arrangement and number of regions shown in FIG. 8 is merely an example. The NOC 808 is an example of the common infrastructure that is available within the SOC 800 to connect selected components and/or subsystems.

NOC 808 provides connectivity to PL 804, PS 806, and to selected ones of the hardwired circuit blocks 810. NOC 808 is programmable. In the case of a programmable NOC used with other programmable circuitry, the nets that are to be routed through NOC 808 are unknown until a user circuit design is created for implementation within the SOC 800. NOC 808 may be programmed by loading configuration data into internal configuration registers that define how elements within NOC 808 such as switches and interfaces are configured and operate to pass data from switch to switch and among the NOC interfaces.

NOC 808 is fabricated as part of the SOC 800 and while not physically modifiable, may be programmed to establish connectivity between different master circuits and different slave circuits of a user circuit design. NOC 808, for example, may include a plurality of programmable switches that are capable of establishing packet switched network connecting user specified master circuits and slave circuits. In this regard, NOC 808 is capable of adapting to different circuit designs, where each different circuit design has different combinations of master circuits and slave circuits implemented at different locations in the SOC 800 that may be coupled by NOC 808. NOC 808 may be programmed to route data, e.g., application data and/or configuration data, among the master and slave circuits of the user circuit design. For example, NOC 808 may be programmed to couple different user-specified circuitry implemented within PL 804 with PS 806, and/or DPE array 802, with different hardwired circuit blocks, and/or with different circuits and/or systems external to the SOC 800.

The hardwired circuit blocks 810 may include input/output (I/O) blocks, and/or transceivers for sending and receiving signals to circuits and/or systems external to SOC 800, memory controllers, or the like. Examples of different I/O blocks may include single-ended and pseudo differential I/Os and high-speed differentially clocked transceivers. Further, the hardwired circuit blocks 810 may be implemented to perform specific functions. Examples of hardwired circuit blocks 810 include, but are not limited to, cryptographic engines, digital-to-analog converters, analog-to-digital converters, and the like. The hardwired circuit blocks 810 within the SOC 800 may be referred to herein from time-to-time as application-specific blocks.

In the example of FIG. 8, PL 804 is shown in two separate regions. In another example, PL 804 may be implemented as a unified region of programmable circuitry. In still another example, PL 804 may be implemented as more than two different regions of programmable circuitry. The particular organization of PL 804 is not intended as a limitation. In this regard, SOC 800 includes one or more PL regions 804, PS 806, and NOC 808. DPE array 802 may be optionally included.

In other example implementations, the SOC 800 may include two or more DPE arrays 802 located in different regions of the IC. In still other examples, the SOC 800 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A system comprising:
   a processing engine; and,
   a data store coupled to the processing engine and containing a program of instructions that, when executed by the processing engine, cause the processing engine to perform operations to predict equalization parameters for a receiver, the operations comprising:
   (a) retrieving, by the processing engine, a first set of pre-processed training data from the data store;
   (b) performing a first training on a first neural network model in response to the retrieved first set of pre-processed training data;
   (c) determining whether all of the equalization parameters are tracked under the first training; and,
   (d) if not all of the equalization parameters are tracked under the first training, then, preparing a second set of training data and performing a second training on a cascaded model, wherein the cascaded model comprises the first neural network model and a second neural network model, and the second set of training data comprises successfully predicted data generated by the first neural network model.

2. The system of claim 1, wherein the operations further comprise:
   (e) determining whether all of the equalization parameters are tracked under the second training; and
   (f) if all of the equalization parameters are tracked under the second training, then, checking whether the training on the cascaded model is converged or not.

3. The system of claim 2, wherein the operations further comprise:
   (g) if the training on the cascaded model is converged, then, comparing corresponding equalization parameters predicted by the cascaded model with a second predetermined criteria to determine whether the predicted equalization parameters predicted by the cascaded model are successful.

4. The system of claim 1, wherein the operations further comprise:
   retrieving, by the processing engine, a third set of pre-processed training data from the data store; and,
   training the second neural network model in response to the third set of pre-processed training data.

5. The system of claim 4, wherein the operations further comprise:
   checking whether the training on the second neural network model is converged or not; and,
   if the training on the second neural network model is converged, then, comparing corresponding equalization parameters predicted by the second neural network model with a third predetermined criteria to determine whether the predicted equalization parameters predicted by the second neural network are successful and storing corresponding successfully predicted equalization parameters generated by the second neural network model.

6. The system of claim 1, wherein the operations further comprise:
   if all of the equalization parameters are tracked under the first training, then, checking whether the training on the first neural network model is converged or not.

7. The system of claim 6, wherein the operations further comprise:
   if the training on the first neural network model is converged, then, comparing corresponding equalization parameters predicted by the first neural network model with a first predetermined criteria to determine whether the predicted equalization parameters predicted by the first neural network are successful and storing corresponding successfully predicted equalization parameters generated by the first neural network model.

8. The system of claim 6, wherein the operations further comprise:
   if the training on the first neural network model is not converged, then, increasing corresponding training iteration configuration of the first neural network model and rechecking the convergency of the training on the first neural network model.

9. The system of claim 1, wherein the pre-processed training data comprises (i) training input data extracted from an input waveform received by the receiver and (ii) corresponding equalization parameters of the receiver in response to the input waveform.

10. The system of claim 9, wherein the equalization parameters comprise decision feedback equalizer (DFE) taps and automatic gain control (AGC) codes.

11. A method to provide a trained model to predict a receiver's equalization parameters, the method comprising:
   (a) retrieving a first set of pre-processed training data extracted from the receiver;
   (b) performing a first training on a first neural network model in response to the retrieved first set of pre-processed training data;
   (c) determining whether all equalization parameters of the receiver are tracked under the first training; and,
   (d) if not all equalization parameters are tracked under the first training, then, preparing a second set of pre-processed training data and performing a second training on a cascaded model, wherein the cascaded model comprises the first neural network model and a second neural network model, and the second set of training data comprises successfully predicted data generated by the first neural network model.

12. The method of claim 11, further comprising:
   (e) determining whether all equalization parameters are tracked under the second training; and
   (f) if all equalization parameters are tracked under the second training, then, checking whether the training on the cascaded model is converged or not.

13. The method of claim 12, further comprising:
   (g) if the training on the cascaded model is converged, then, comparing corresponding equalization parameters predicted by the cascaded model with a second predetermined criteria to determine whether the predicted equalization parameters predicted by the cascaded model are successful.

14. The method of claim 11, further comprising:

retrieving a third set of pre-processed training data; and, training the second neural network model in response to the third set of pre-processed training data.

15. The method of claim 14, further comprising:

checking whether the training on the second neural network model is converged or not; and, if the training on the second neural network model is converged, then, comparing corresponding equalization parameters predicted by the second neural network model with a third predetermined criteria to determine whether the predicted equalization parameters predicted by the second neural network are successful and storing corresponding successfully predicted equalization parameters generated by the second neural network model.

16. The method of claim 11, further comprising:

if all equalization parameters are tracked under the first training, then, checking whether the training on the first neural network model is converged or not.

17. The method of claim 16, further comprising:

if the training on the first neural network model is converged, then, comparing corresponding equalization parameters predicted by the first neural network model with a first predetermined criteria to determine whether the predicted equalization parameters predicted by the first neural network are successful and storing corresponding successfully predicted equalization parameters generated by the first neural network model.

18. The method of claim 16, further comprising:

if the training on the first neural network model is not converged, then, increasing corresponding training iteration configuration of the first neural network model and recheck the convergency of the training on the first neural network model.

19. The method of claim 11, further comprising:

extracting training input data from an input waveform received by the receiver and extracting corresponding equalization parameters of the receiver in response to the input waveform; and, pre-processing the extracted training input data and corresponding equalization parameters.

20. The method of claim 19, wherein the equalization parameters comprise DFE taps and AGC codes.

* * * * *